United States Patent
Ishida

(10) Patent No.: US 6,445,041 B1
(45) Date of Patent: Sep. 3, 2002

(54) SEMICONDUCTOR MEMORY CELL ARRAY WITH REDUCED PARASITIC CAPACITANCE BETWEEN WORD LINES AND BIT LINES

(75) Inventor: Minoru Ishida, Tokyo (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 09/617,487

(22) Filed: Jul. 14, 2000

(30) Foreign Application Priority Data

Jul. 16, 1999 (JP) .......................................... 11-202825

(51) Int. Cl.[7] .............................................. H01L 29/94
(52) U.S. Cl. ...................................... 257/369; 257/390
(58) Field of Search ................................ 257/369, 368, 257/394, 390

(56) References Cited

U.S. PATENT DOCUMENTS

| | | | | |
|---|---|---|---|---|
| 4,618,945 A | * | 10/1986 | Sakurai et al. | |
| 5,332,688 A | * | 7/1994 | Hashimoto et al. | |
| 5,336,914 A | * | 8/1994 | Andoh | |
| 5,489,790 A | * | 2/1996 | Lage | |
| 6,054,742 A | * | 4/2000 | Gonzalez | |

* cited by examiner

*Primary Examiner*—Keith Christianson
*Assistant Examiner*—Stephen W. Smoot
(74) *Attorney, Agent, or Firm*—Rader, Fishman & Grauer PLLC; Ronald P. Kananen, Esq.

(57) ABSTRACT

Provided is a semiconductor memory device in which SRAM has a construction such that an nMOS transistor formation region and a pMOS transistor formation region are disposed in a direction along which a bit line extends, thereby reducing delay in the bit line caused by wiring parasitic capacity. A main word line has a shape such that the main word line is disposed every two memory cell rows avoiding a bit line contact and part of the main word line extends to the row adjacent to the two rows. Accordingly, the main word line can be easily formed in the layer below the bit lines. In the bit lines, wiring parasitic capacity between the main word line and the bit line is reduced and therefore delay in the bit line is eliminated. As a result, time delay in memory operation is reduced.

10 Claims, 19 Drawing Sheets

| | Conventional SRAM | | | SRAM of the present invention | | |
|---|---|---|---|---|---|---|
| | Function of wiring layer | Wiring parasitic capacity per length | Operation time delay due to wiring parasitic capacity | Function of wiring layer | Wiring parasitic capacity per length | Operation time delay due to wiring parasitic capacity |
| Wiring layer X (layer insulating film=500nm thick) | Main Word line | 0.1fF/μm | 0.14nsec | Bit line | 0.1fF/μm | 0.60nsec |
| Wiring layer X-1 (layer insulating film=500nm thick) | Bit line | 0.2fF/μm | 1.20nsec | Main Word line | 0.2fF/μm | 0.28nsec |
| Wiring layer X-2 | Vss/Vdd line | | | | | |
| | Bit line delay+MWL delay=1.34nsec | | | Bit line delay+MWL delay=0.88nsec | | |
| | Delay in other operation =2.42nsec | | | Delay in other operation =2.42nsec | | |
| | Total SRAM operation delay=3.76nsec | | | Total SRAM operation delay=3.30nsec | | |

FIG.14

SEMICONDUCTOR MEMORY CELL ARRAY WITH REDUCED PARASITIC CAPACITANCE BETWEEN WORD LINES AND BIT LINES

BACKGROUND OF THE INVENTION

1. Field of the Invention

The invention relates to a semiconductor memory device with a SRAM (Static Random Access Memory) configuration. Specifically, this invention relates to a semiconductor memory device in which in each memory cell, two transistor formation regions are disposed so as to extend in the same direction along which a bit line extends, respectively and a voltage potential supply line and a standard potential supply line are disposed parallel to the direction along which the bit line extends.

2. Description of the Related Art

A SRAM cell generally has a latch and two transistors (word transistors). On-off operations of the transistors are controlled based on the voltage applied to a word line and thereby connection between each of two memory nodes of the latch and a bit line is made or broken. The SRAM cells can be broadly divided into two types, namely a MOS transistor load type and a high resistance load type, based on a difference in the load element of the latch. The SRAM cell of the MOS transistor load type comprises two n-channel type MOS transistors in which the latch functions as a drive transistor (hereinafter referred to as nMOS transistor) and two p-channel type MOS transistors in which the latch functions as a load transistor (hereinafter referred to as pMOS transistor). In this SRAM, one CMOS inverter is composed of one n-MOS transistor and one pMOS transistor and the other CMOS inverter is composed of the other nMOS transistor and the other pMOS transistor. These two CMOS invertors are connected crossing each other and thereby a latch is formed.

This SRAM is not a charge holding type such as a random access memory (DRAM) but a current driving type by a latch so that high-speed access is possible. However, as high-speed operation in a microprocessor is realized, further high-speed operation in the SRAM is required.

In general, conventionally, the wiring structure of this type of SRAM cell is as follows. A polycrystalline silicon layer which will comprise a gate electrode is formed on a semiconductor substrate such as silicon. Node wiring as a first metal wiring layer, word wiring as a second metal wiring layer, voltage potential supply lines (power supply voltage line) and reference potential supply lines (grounded line) as a third metal wiring layer, bit lines as a fourth metal wiring layer and main word lines as a fifth metal wiring layer are stacked in sequence. The main word line is for inputting a common drive signal to a predetermined word line driver. When seen from above, the main word lines are formed in the most upper layer and the bit lines are formed between the main word line, and the power supply voltage line and the grounded line.

By the way, in this type of SRAM cell, generally signal delay in a bit line and a main word line occurs. One of the main reasons why delay in a bit line (referred to as bit line delay hereinafter) and delay in a main word line (referred to as main word line delay) occurs is because when pulling up or down the bit line and main word line, charge is also needed for parasitic capacity of the bit line and main word line. Duration of the wiring delay is almost equal to the amount of its wiring capacitance. Here, in the cell having the above-described configuration, in the bit line, parasitic capacity occurs both between the main word line in the upper layer and the bit line, and between the power supply voltage line and the grounded line in the lower layer and the bit line. On the other hand, in the main word line, parasitic capacity occurs between the bit line in the lower layer and the main word line. However, since there is no upper layer, parasitic capacity is smaller than that of the bit line. Consequently, when the bit line delay and main word line delay are compared, the bit line delay is larger than the main word delay by a difference of approximately 4:1 to 10:1.

In order to reduce the above-described bit line delay, preferably, the main word line is formed in the layer below the bit line. However, when the main word line is formed in the layer below the bit line, the main word line needs to be disposed avoiding a contact (bit line contact) corresponding to the bit line.

FIGS. 18A to 18C show the layout of a conventional SRAM in each step. In this SRAM, two bit line contacts 201a and 201b are formed on one side of a memory cell 200 in a rectangular shape as illustrate in FIG. 18A. On another side of the memory cell 200, a power supply voltage line contact 202a and a grounded line contact 202b are formed. Adjacent two memory cells 200 are disposed in mirror symmetry with one side as a boundary facing the side in which the bit line contacts 201a and 201b are formed. Each one of the bit line contacts 201a and 201b is arranged every two rows in a direction along which the bit line extends. Thus, in this SRAM there is enough space for a main word line to be disposed so as to avoid the bit line contacts 201a and 201b. FIG. 18B shows a state such that a main word line 204 in a rectangular shape is formed with bit line connection wires 203a and 203b. FIG. 18C shows a state such that bit lines 205a and 205b are formed so as to be connected to bit line connection wires 203a and 203b in the layer above the main word line 204. That is, in the memory cell 200, by forming the main word line 204 in a rectangular shape, sufficient width is secured and thereby sufficiently low resistance can be obtained.

Incidentally, another type of SRAM exists such that by shortening a bit line, its capacity and resistance is reduced, thereby improving access speed. This type of SRAM has a layout illustrated in FIG. 19, for example.

This SRAM cell is a split word line type. In the SRAM, each memory cell 300 includes two p-type active regions 301a and 301b in which an n-channel MOS transistor as a drive transistor will be formed, and two n-type active regions 302a and 302b in which a p-channel MOS transistor as a load transistor will be formed. The two p-type active regions 301a and 301b have a step 306, respectively and are disposed parallel to each other in a vertical direction in the figure. In the p-type active region 301a, a drive transistor Qn1 and a word transistor Qn3 are formed sandwiching the step 306 in between. In the p-type active region 301b, a word transistor Qn4 and a word transistor Qn2 are formed sandwiching the step 306 in between. A word line 304a (WL1) serving also as a gate electrode for the word transistor Qn3 is disposed orthogonal to the p-type active region 301a. A word line 304b (WL2) serving also as a gate electrode for the word transistor Qn4 is disposed orthogonal to the p-type active region 301b. A common gate line 305a (GL1) serving also as a gate electrode for the drive transistor Qn1 is placed orthogonal to the p-type active region 301a in a vertical direction in the figure. A common gate line 305b (GL2) serving also as a gate electrode for the drive transistor Qn2 is placed orthogonal to the p-type active region 301b in a vertical direction in the figure. The common gate lines 305a and 305b and word lines 305a and 305b are formed of a polycrystalline silicon layer as a first layer including impurities.

The common gate line 305a is also orthogonal to the n-type active region 302a. The common gate line 305b is also orthogonal to the n-type active region 302b. As s result, pMOS (load transistor Qp1 or Qp2) is formed in the n-type active regions 302a and 302b, respectively. A first inverter is composed of the load transistor Qp1 and the drive transistor Qn1. A second inverter is composed of the load transistor Qp2 and the drive transistor Qn2. The first inverter and the second inverter comprise a latch.

The p-type active regions 301a and 301b are electrically coupled to the bit line through bit line contacts 307a and 307b and to a grounded line (common potential supply line) Vss through grounded line contacts 308a and 308b, respectively. The p-type active region 301a and n-type active region 302a, and the p-type active region 301b and n-type active region 302b are electrically coupled to each other through contacts (not shown). The n-type active regions 302a and 302b are electrically coupled to a voltage potential supply line Vcc through power supply voltage line contacts 309a and 309b, respectively.

In this SRAM cell, the nMOS transistor formation region (p-type active regions 301a and 301b) in which an n-MOS transistor will be formed, and the pMOS transistor formation region (n-type active regions 302a and 302b) in which a pMOS transistor will be formed are disposed in the same direction (in the horizontal direction in FIG. 19) as the direction along which the bit line (not shown) extends. Therefore, the bit line is shortened and its capacity and resistance is reduced, thereby improving access speed.

However, in this conventional SRAM cell shown in FIG. 19 each one of the bit line contacts 307a and 307b are placed in one row and bit line contacts 307a and 307b are disposed in a different position in the cell in a direction along which the bit line extends. Moreover, the width H of one row is narrow, about half of the layout of the conventional SRAM cell. Therefore, in a case where the main word line is formed in the layer below the bit line as described above, if the main word line has a rectangular shape as the conventional memory cell, sufficient width with sufficiently low resistance cannot be obtained. More specifically, in the SRAM cell with the layout shown in FIG. 19, although the bit line can be shortened in each cell, it is difficult to reduce bit line delay caused by wiring parasitic capacity between the bit line and the main word line, thus high-speed operation is not possible.

SUMMARY OF THE INVENTION

This invention is designed to overcome the foregoing problems. It is an object of the invention to provide a semiconductor memory device having a configuration such that an n-MOS transistor formation region and a PMOS transistor formation region are formed so as to extend in the same direction along which a bit line extends, so that bit line delay caused by wiring parasitic capacity can be reduced and high-speed operation is realized.

According to the present invention, in a semiconductor memory device including in each memory cell a first and second nMOS transistor connected crossing over each other and a first and second pMOS transistor which are respectively connected between a drain of the NMOS transistor and a power supply voltage line. An nMOS transistor formation region in which the first and the second nMOS transistor will be formed, and a pMOS transistor formation region in which the first and the second pMOS transistor will be formed are disposed in the same direction along which the bit line extends, respectively. Formed in the layer below the bit line is a main word line which inputs a common drive signal to a predetermined word line driver. Moreover, the main word line is arranged so as to avoid a bit line contact which electrically connects the bit line and a transistor region disposed in the layer below the main word line.

In the semiconductor memory device according to the present invention, since the main word line is formed so as to avoid the region where the bit line contact is formed, the main word line can be formed in the layer below the bit line, and delay (bit line delay) caused by wiring parasitic capacity between the bit line and the main word line is eliminated. As a result, high-speed operation in the memory cell is made feasible in the bit line.

Other and further objects, features and advantages of the invention will appear more fully from the following description.

BRIEF DESCRIPTION OF THE DRAWINGS

FIG. 14 is a figure showing results of comparison of operation time delay of the conventional SRAM cell and the SRAM cell of the invention.

DETAILED DESCRIPTION OF THE PREFERRED EMBODIMENTS

Embodiments of the present invention will be described in detail below with reference to the accompanying drawings.

Figure 2:
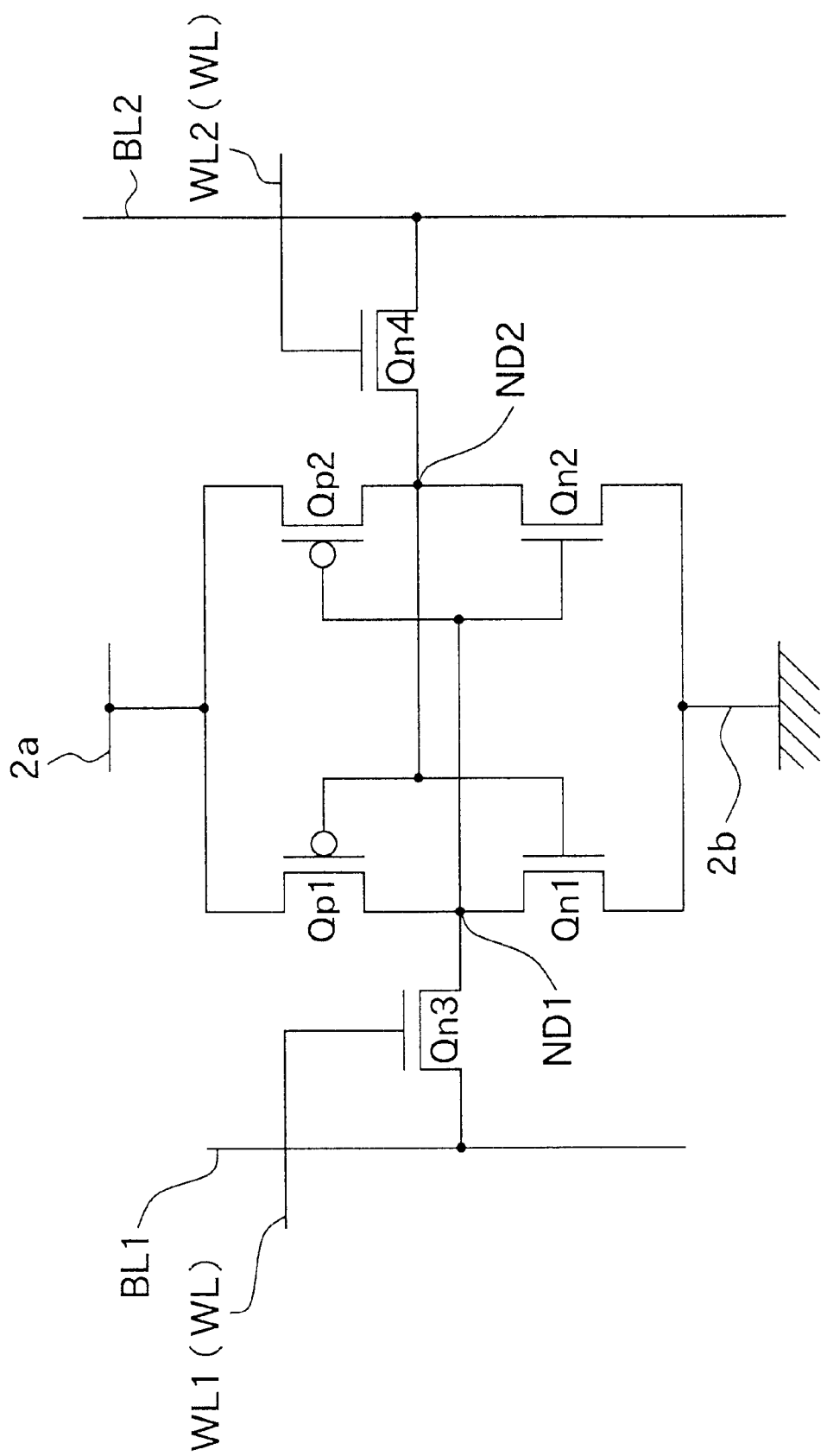
FIG. 2 is a circuit diagram of the cell in the SRAM cell array shown in FIG. 1.

First, a circuit configuration of pMOS load type SRAM cell according to an embodiment of the present invention will be described with reference to FIG. 2.

The SRAM cell of the pMOS load type includes n-channel MOS transistors (hereinafter referred to as nMOS) Qn1 and Qn2, and p-channel MOS transistors (hereinafter referred to as pNOS) Qp1 and Qp2. The nMOS Qn1 and Qn2 work as drive transistors while the PMOS Qp1 and Qp2 work as load transistors. The pMOS Qp1 and Qp2, and the nMOS Qn1 and Qn2 form two inverters. Input terminals of the inverters cross each other; an input terminal of one inverter is connected to an output terminal of another inverter, while an input terminal of the latter inverter is connected to an output terminal of the former inverter.

The nMOS Qn3 and Qn4 are word transistors for controlling the connection of connecting points (memory nodes ND1 and ND2) of each inverter to bit lines BL1 and BL2 based on the voltage applied to word lines WL1 and WL2. This cell configuration is common, and a more detailed description of the connection is omitted.

In the SRAM cell of the PMOS load type, one bit line BL1 is maintained at a high potential while a predetermined voltage is applied to the gate of the word transistors Qn3 and Qn4 through word lines WL1 and WL2. Therefore, both transistors Qn3 and Qn4 are turned to ON to accumulate charge in the memory nodes ND1 and ND2. The drive transistors Qn1 and Qn2, and the load transistors Qp1 and Qp2 operate such that, when one memory node is "H(high)", another memory node is "L(low)", as a characteristic of a latch configuration. For example, when the memory node ND1 is "H" and the memory node ND2 is "L", the transistors Qn2 and Qp1 are turned to ON and the transistors Qn1 and Qp2 are turned to OFF. As a result, the memory node ND1 receives charge from a supply line of a source voltage Vcc, and the memory node ND2 is continuously kept at the grounded potential. Conversely, if the memory node ND1 is forced to "L" by turning the word transistor Qn3 to ON when the bit line BL1 potential is "L", or if the memory node ND2 is forced to "H" by turning the word transistor Qn4 to ON when the bit line BL 2 potential is "H", the transistors Qn1, Qn2, Qp1 and Qp2 are all inverted, and the memory node ND2 receives charge from the supply line of the source voltage Vcc to keep the memory node ND1 at the grounded potential. In this way, maintaining charge by the latch keeps charge in the memory nodes ND1 and ND2 statically. The potential of "L" or "H" is made to correspond to data of "0" or "1", respectively, so that the data can be stored in six transistors within the cell.

Figure 3:
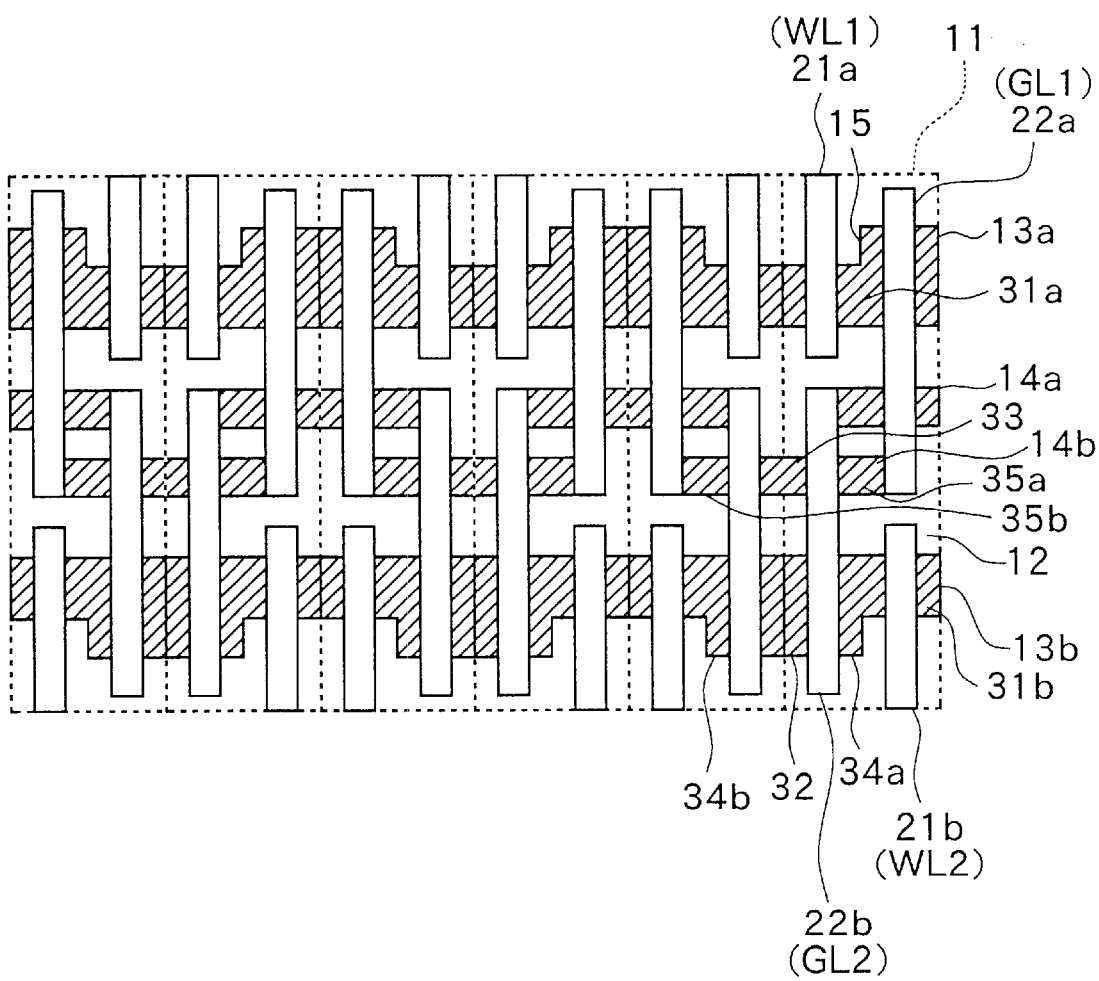
FIG. 3 shows a pattern configuration, explaining a step in the manufacturing process of the SRAM cell array shown in FIG. 1.

FIG. 3 shows a configuration of a basic pattern of the split word line type SRAM cell with six transistors described above. In this SRAM, each memory cell 11 includes two p-type active regions 13a and 13b, in which an n-channel MOS transistor serving as a drive transistor will be formed, and two n-type active regions 14a and 14b, in which a p-channel MOS transistor serving as a load transistor will be formed. The two p-type active regions 13a and 13b have a step 15, respectively and are arranged in parallel in a vertical direction in the drawing. In the p-type active region 13a, a drive transistor Qn1 and a word transistor Qn3 shown in FIG. 2 are formed sandwiching the step 15 therebetween. In the p-type active region 13b, a word transistor Qn4 and a drive transistor Qn2 shown in FIG. 2 are formed sandwiching the step 15 therebetween. A word line 21a (WL1) serving as a gate electrode of the word transistor Qn3 is placed orthogonal to the p-type active region 13a, whereas a word line 21b (WL2) serving as a gate electrode of the word transistor Qn4 is disposed orthogonal to the p-type active region 13b. A common gate line 22a (GL1) serving as a gate electrode of the drive transistor Qn1 shown in FIG. 2 is disposed orthogonal to the p-type active region 13a in a vertical direction in the drawing, while a common gate line 22b (GL2) serving as a gate electrode of the drive transistor Qn2 shown in FIG. 2 is placed orthogonal to the p-type active region 13b in a vertical direction in the drawing. The common gate lines 22a and 22b and the word lines 21a and 21b are formed with a polycrystalline silicon layer comprising a first layer including impurities.

The common gate line 22a is also orthogonal to the n-type active region 14a, and the common gate line 22b is also orthogonal to the n-type active region 14b. Therefore, the pMOS (the load transistor Qp1 or Qp2) shown in FIG. 2 is formed in the n-type active regions 14a and 14b, respectively. A first inverter is composed of the load transistor Qp1 and the drive transistor Qn1, while a second inverter is composed of the load transistor Qp2 and the drive transistor Qn2. The first inverter and the second inverter constitute a latch.

Figure 1:
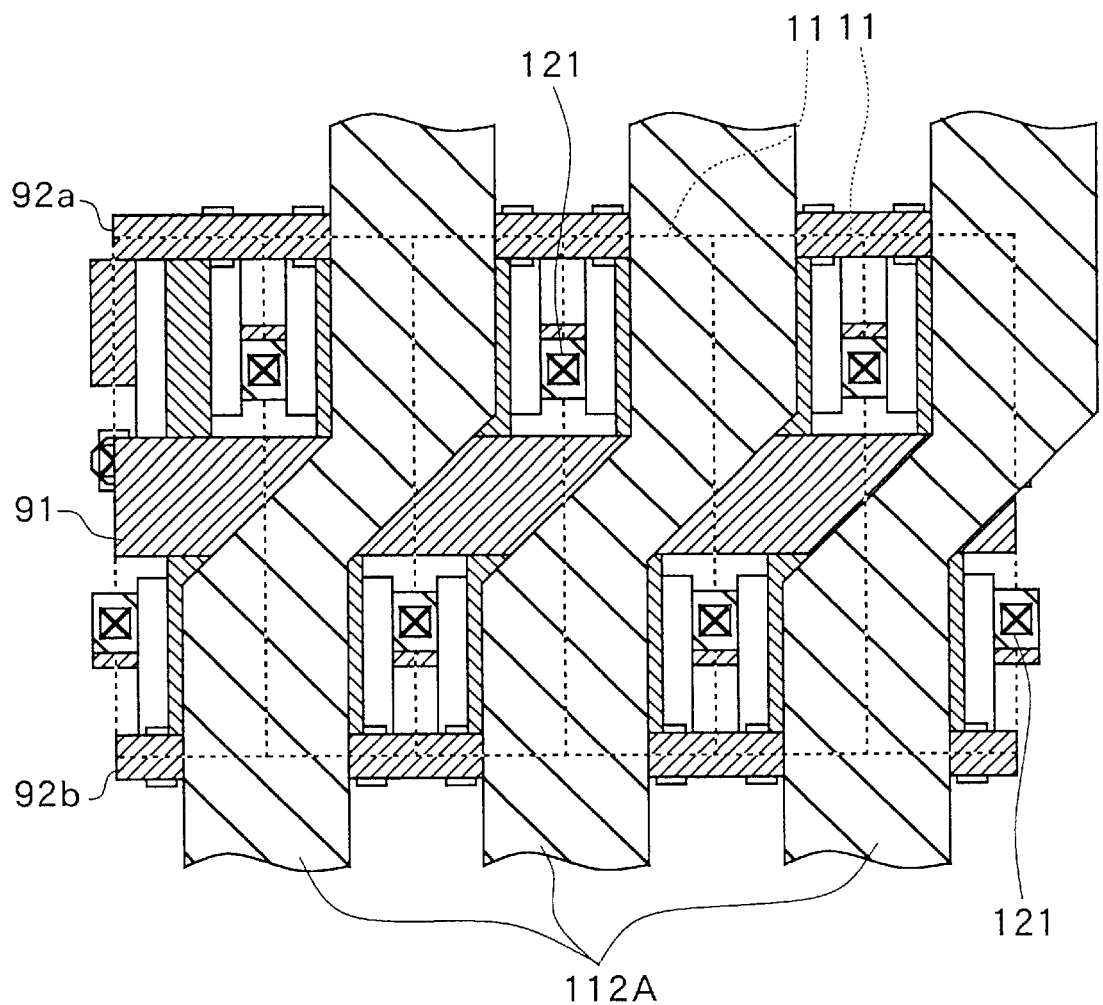
FIG. 1 is a schematic configuration showing a pattern of a SRAM cell array according to an embodiment of the present invention.

SRAM according to the embodiment has a configuration such that in a memory cell with the above-described basic pattern, a main word line is formed in a layer below the bit line and the main word line is placed so as to avoid a bit line contact as shown in FIG. 1.

More specifically, in the embodiment a plurality of the SRAM cells 11 in a rectangular shape indicated in a broken line in FIG. 1 is placed adjacent to each other. Grounded lines (Vss line) 92a and 92b are disposed facing along the p-type active regions 13a and 13b shown in FIG. 3, respectively so as to cross the SRAM cell array, while a power supply voltage line (VDD line) 91 is disposed facing along the n-type active regions 14a and 14b, respectively so as to cross the SRAM cell array. Main word lines 112A are placed every other row orthogonal to the direction along which the power supply voltage line 91 and the grounded lines 92a and 92b extend. The bit lines (not shown) are disposed on the main word lines 112A parallel to the direction along which the power supply voltage line 91 and the grounded lines 92a and 92b extend. Bit line contacts 121 to be connected to the bit lines are placed in such a manner that on two sides of a memory cell 11 facing toward each other bit line contacts 121 are placed in a different position, respectively. That is, every other bit line contact 121 is provided in the same position on the side of memory cells in a direction along which the SRAM cell array lies. The main word line 112A has such a shape that the main word line 112A is disposed every two rows so as to avoid the bit line contacts 121 and part of the main word line 112A extends to the row adjacent to neighboring two rows.

As described above, in the embodiment a plane pattern of the main word line 112A is not straight and is formed so as to avoid a bit line contact connection wiring 111 (shown in FIG. 11) and the bit line contact 121. Thus, the main word line 112A is easily formed in the layer below the bit lines 131a and 131b (shown in FIG. 13). As a result, delay (bit line delay) caused by wiring parasitic capacity between the main word line 112A and the bit lines 131a and 131b is eliminated in the bit lines 131a and 131b and thereby time-delay during memory operation is reduced.

With reference to FIGS. 3 through 13, a manufacturing process of the above-described SRAM will be described.

In the embodiment, as shown in FIG. 3, first, in each memory cell 11, an element separation region 12 of, for example, LOCOS (Local Oxidation of Silicon), trench construction, or the like is formed on the surface, where a p-type well region and n-type well region (not shown) are formed, of a semiconductor substrate, e.g., a silicon wafer. By this formation, the surface region of the p-type well region where the element separation region 12 is not formed becomes the p-type active regions 13a and 13b in which an nMOS channel will be formed, whereas the surface region of the n-type well region where the element separation region 12 is not formed becomes the n-type active regions 14a and 14b in which a pMOS channel will be formed. Each of the two pairs of active regions 13a and 13b, and 14a and 14b has a rectangular pattern and is formed parallel to each other.

Next, ion implantation for gate threshold voltage control and for a channel stopper is performed as necessary. After that, a gate oxidation film, a polycrystalline silicon layer or polycide layer (referred to as "1PS" hereinafter) as a first layer, and an offset insulating film are formed in sequence on the whole surface. 1PS is, for example, formed of a polycrystalline silicon film and Wsix (tungsten-silicide) film. The gate oxidation film and offset insulating film are made of oxidation silicon. The thickness of the polycrystalline silicon film and Wsix film is, for example, about 70 nm. The thickness of the offset insulating film is about 200 nm, for example. The polycrystalline silicon film becomes conductive by implanting impurities at the time of forming the film or after completing the formation of the film.

Subsequently, the offset insulating film, Wsix film, polycrystalline silicon film and gate oxidation film are consecutively processed using a gate electrode pattern. By this process, the two word lines 21a and 21b (WL1 and WL2), each of which serves as the gate electrode of the word transistor Qn3 or Qn4, the common gate line 22a (GL1) serving as the gate electrode of the drive transistor Qn1 or load transistor Qp1, and the common gate line 22b (GL2) serving as the gate electrode of the drive transistor Qn2 or load transistor Qp2 are formed simultaneously.

The two word lines 21a and 21b are disposed parallel to each other and orthogonal to the p-type active regions 13a and 13b near both ends thereof. The common gate lines 22a and 22b are disposed between the word lines 21a and 21b and orthogonal to both p-type active regions 13a and 13b and n-type active regions 14a and 14b. Also, the common gate lines 22a and 22b are spaced uniformly with the word lines 21a and 21b and are disposed parallel to each other. The word lines 21a and 21b, and the common gate lines 22a and 22b are patterned to have a rectangular shape, respectively.

Next, the impurity region to become a source and drain of each transistor is formed by the well-known transistor formation process. Thus, formed are diffusion layer regions 31a and 31b to be connected to the bit lines, a diffusion layer region 32 to be connected to the grounded line, a diffusion layer region 33 to be connected to the power supply voltage line Vcc, diffusion layer regions 34a and 34b to become the n-type memory node, and diffusion layer regions 35a and 35b to become the p-type memory node. As a result, in the p-type active regions 13a and 13b, the word transistor Qn3, drive transistor Qn1, drive transistor Qn2, and word transistor Qn4 are formed simultaneously connecting in series, whereas in the n-type active regions 14a and 14b, the load transistors Qp1 and Qp2 are formed simultaneously connecting in series. Thereafter, a first layer insulating film (not shown) is formed on the whole surface and, as needed, the surface is flattened.

Figure 4:
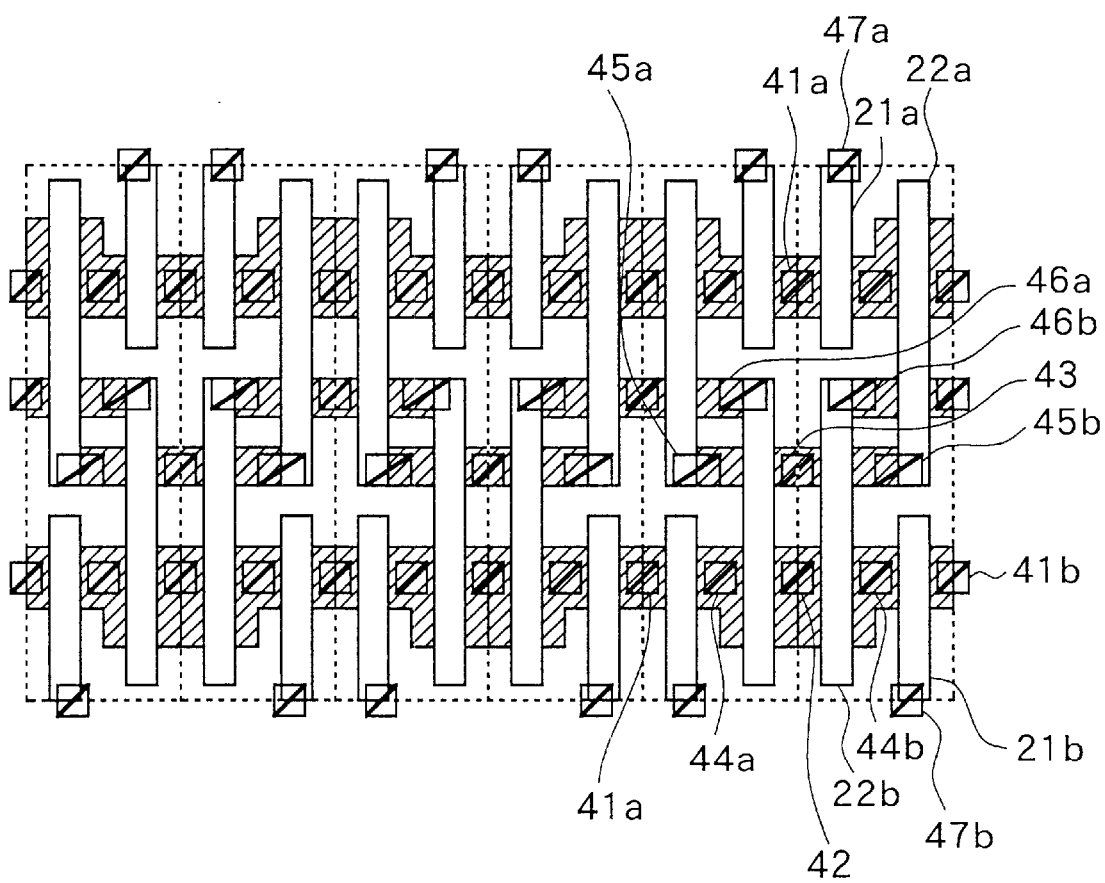
FIG. 4 shows a pattern configuration, explaining a step in the manufacturing process of the SRAM cell array following the step explained in FIG. 3.

Subsequently, as shown in FIG. 4 bit line contacts 41a and 41b are formed in the diffusion layer regions 31a and 31b to which the bit lines are connected, in such a manner that neighboring memory cells share the bit line contacts 41a and 41b. Further, a grounded line contact 42 is formed in the diffusion layer region 32 to which the grounded line is connected; a power supply voltage line contact 43 is formed in the diffusion layer region 33 to which the power supply voltage line is connected; n-type memory node contacts 44a and 44b are formed in the diffusion layer regions 34a and 34b which become the n-type memory node; and p-type memory node contacts 45a and 45b are formed in the diffusion layer regions 35a and 35b, respectively which become the p-type memory node.

The above-described contacts 41a to 45b are formed by a conventional aligned contact method or self aligned contact method. In any step of the contact formation, resist patterns are formed by photolithography and thereafter, anisotropic etching is performed on the first layer insulating film using the resist pattern as a mask.

Further, gate electrode contacts 46a and 46b for connecting n-type memory nodes 34a and 34b and p-type memory nodes 35a and 35b are formed on the common gate lines 22a and 22b. Word line contacts 47a and 47b for connecting the word lines 21a and 21b in the upper layer are formed on the gate electrodes 21a and 21b of the word transistor. The contacts 46a, 46b, 47a and 47b are formed in such a manner that the whole bottom surface or part of the bottom surface of the contacts 46a, 46b, 47a and 47b comes in contact with the top surface of the common gate lines 22a and 22b and word lines 21a and 21b, respectively. In the latter case, since an opening is formed on part of the bottom surface of the contact in the element separation region, etching needs to be performed on the insulating film for making the opening of the contact so that the bottom surface of the contact is in the element separation insulating film.

Figure 5:
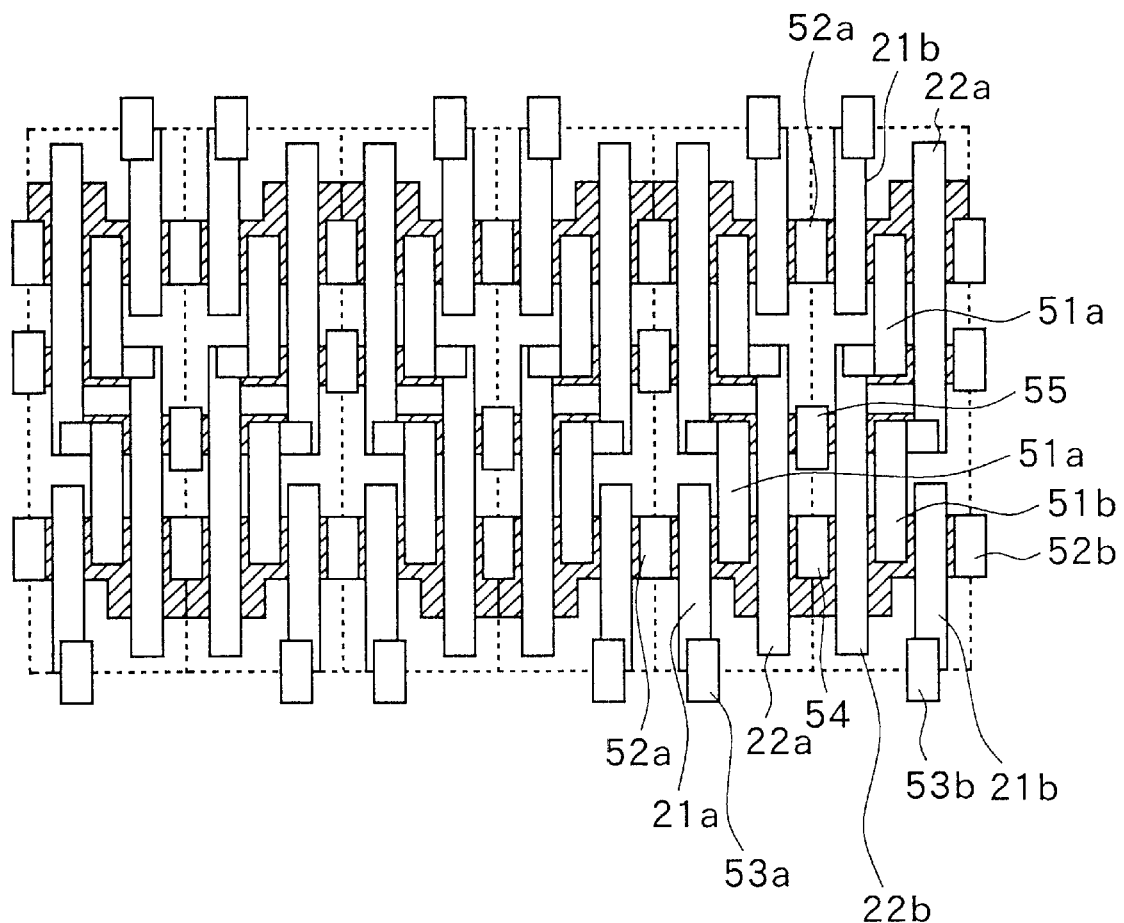
FIG. 5 shows a pattern configuration, explaining a step in the manufacturing process of the SRAM cell array following the step explained in FIG. 4.

Next, as shown in FIG. 5, formed on the first layer insulating film (not shown) are a node wire 51a for connecting an n-type memory node contact 44a, a p-type memory node contact 45a and a gate electrode contact 56b, and a node wire 51b for connecting an n-type memory node contact 44b, a p-type memory node contact 45b and a gate electrode contact 56a.

Bit line connection wires 52a and 52b to be connected to bit line contacts 41a and 41b and word line connection wires 53a and 53b to be connected to the word line contacts 47a and 47b are formed. Further, a grounded line 54 to be connected to the grounded line contact 42 and supply voltage line contact 43, and power supply voltage line 55 are formed. The node wires 51a, 51b and the like are formed of titanium (Ti) or a similar metal with a thickness of about 50 nm to 200 nm by the conventional semiconductor wiring process, for example.

Figure 6:
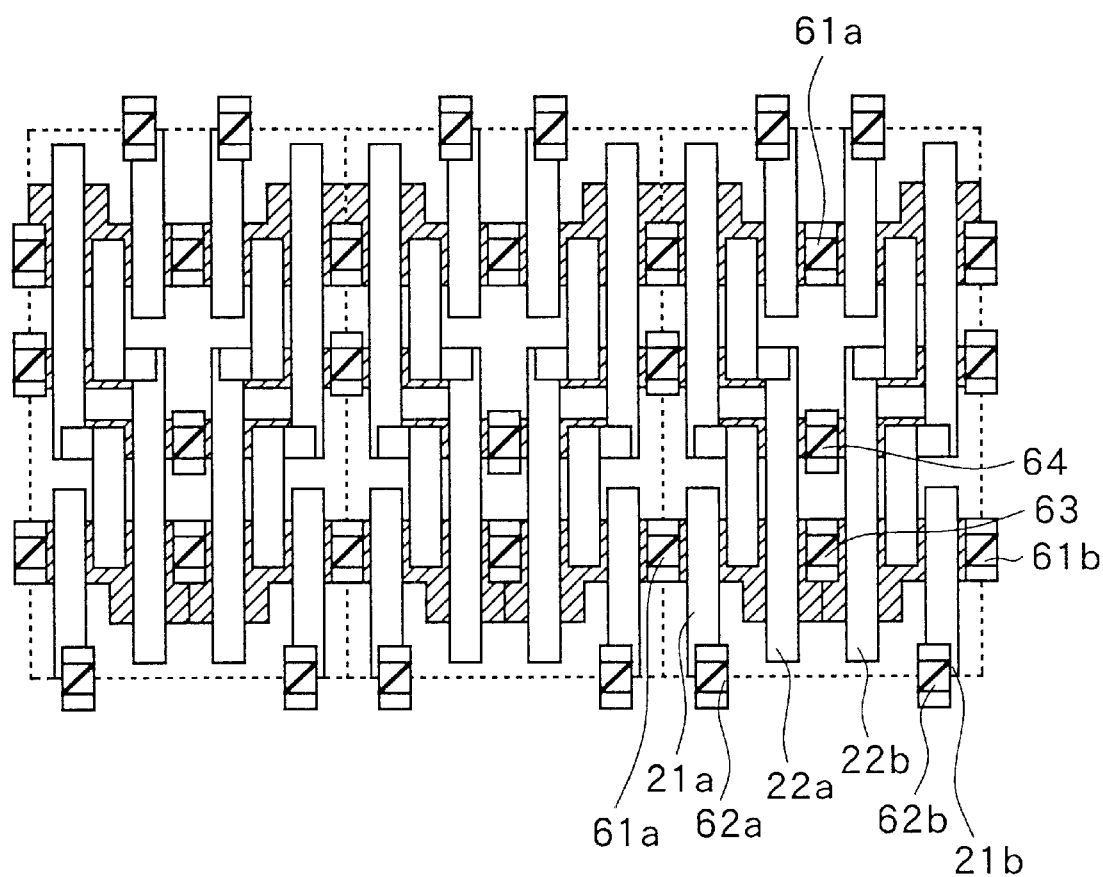
FIG. 6 shows a pattern configuration, explaining a step in the manufacturing process of the SRAM cell array following the step explained in FIG. 5.

As shown in FIG. 6, a second layer insulating film (not shown) is formed on the first layer insulating film (not shown) and wires 51a through 55. After that, bit line contacts 61a and 61b are formed on the bit line connection wires 52a and 52b. Word line contacts 62a and 62b are formed on the word line connection wires 53a and 53b. A grounded line contact 63 is formed on the grounded line 54. Power supply voltage contact 64 is formed on the power supply voltage line 55.

Figure 7:
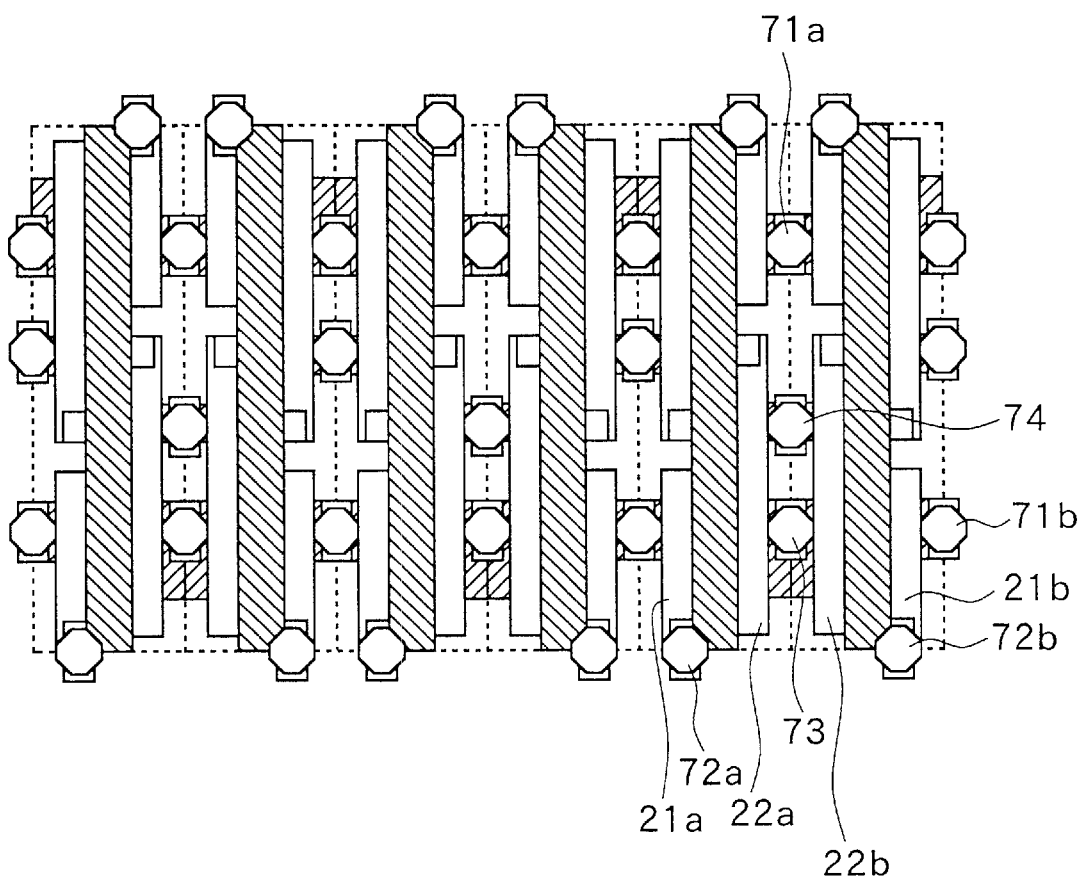
FIG. 7 shows a pattern configuration, explaining a step in the manufacturing process of the SRAM cell array following the step explained in FIG. 6.

As shown in FIG. 7, bit line connection wires 71a and 71b to be connected to the bit line contacts 61a and 61b are formed and then word line connection wires 72a and 72b to be connected to the word line contacts 62a and 62b are formed. A grounded line connection wire 73 to be connected to the grounded line contact 63 and a power supply voltage connection wire 74 to be connected to the power supply voltage contact 64 are formed, respectively.

Figure 8:
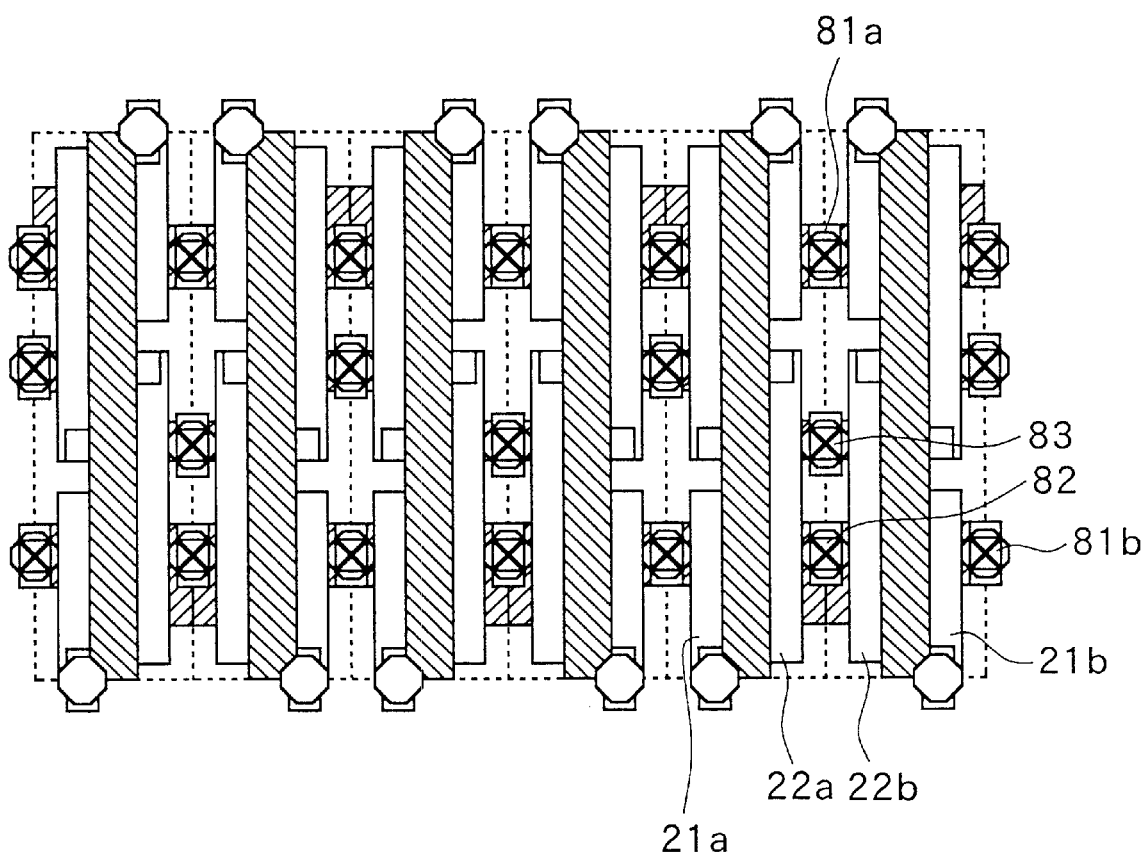
FIG. 8 shows a pattern configuration, explaining a step in the manufacturing process of the SRAM cell array following the step explained in FIG. 7.

As shown in FIG. 8, a third layer insulating film (not shown) is formed on the bit line connection wires 71a and 71b, word line connection wires 72a and 72b, grounded line connection wire 73 and power supply voltage line connection wire 74. Thereafter, formed in this layer insulating film are bit line contacts 81a and 81b in correspondence to the bit line connection wires 71a and 71b, a grounded line contact 82 in correspondence to the grounded line connection wire 73, and a power supply voltage line contact 83 in correspondence to the power supply voltage line connection wire 74.

Figure 9:
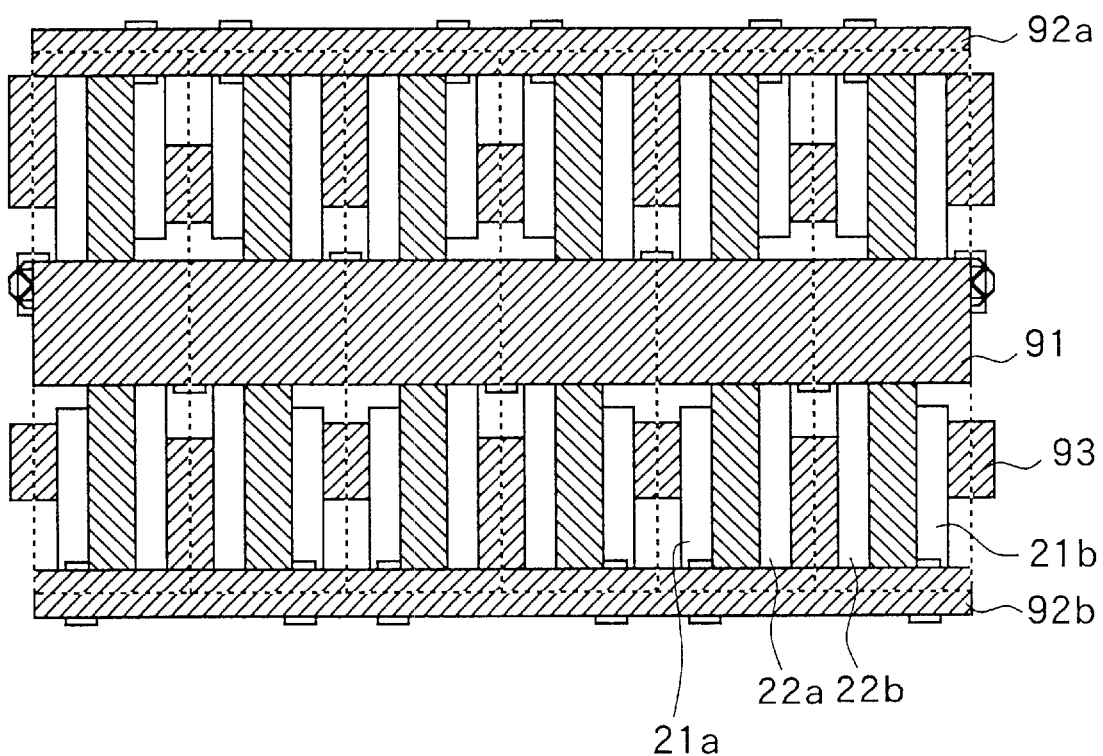
FIG. 9 shows a pattern configuration, explaining a step in the manufacturing process of the SRAM cell array following the step explained in FIG. 8.

As shown in FIG. 9, a power supply voltage line (VDD line) 91, grounded lines (Vss line) 92a and 92b and a bit contact connection wire 93 are formed.

Figure 10:
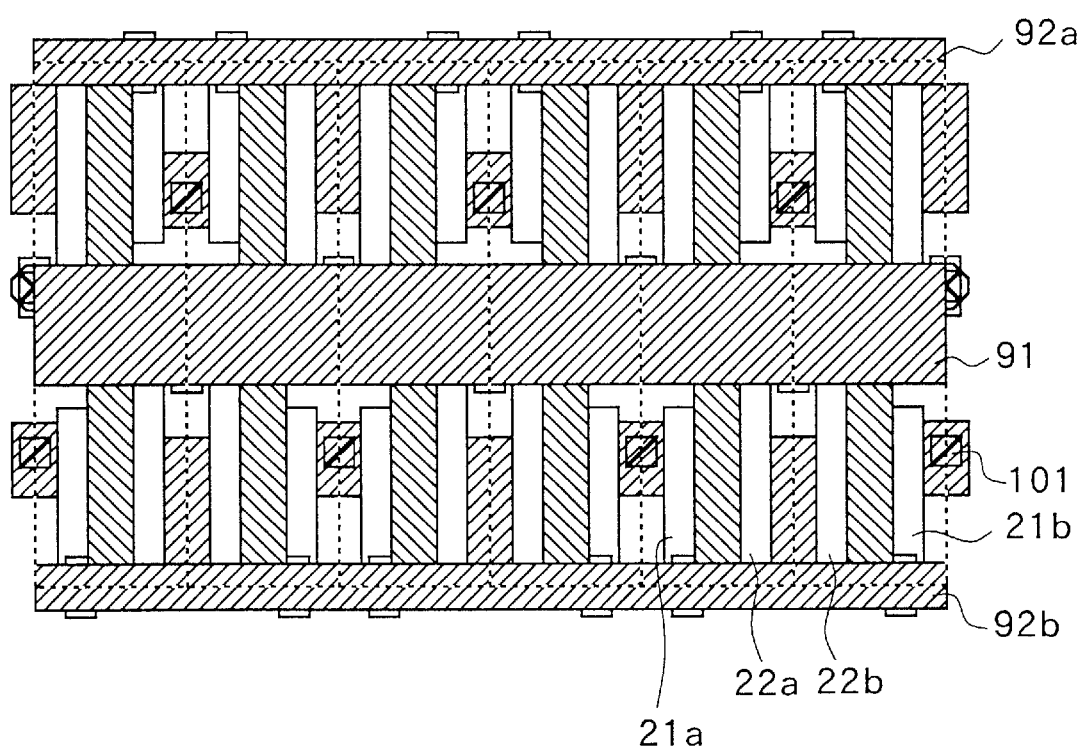
FIG. 10 shows a pattern configuration, explaining a step in the manufacturing process of the SRAM cell array following the step explained in FIG. 9.

As shown in FIG. 10, a fourth layer insulating film (not shown) is formed on the power supply voltage line 91, grounded lines 92a and 92b and bit contact connection wire 93. After that, a bit line contact 101 is formed in correspondence to the bit line connection wire 93 in this layer insulating film.

Figure 11:
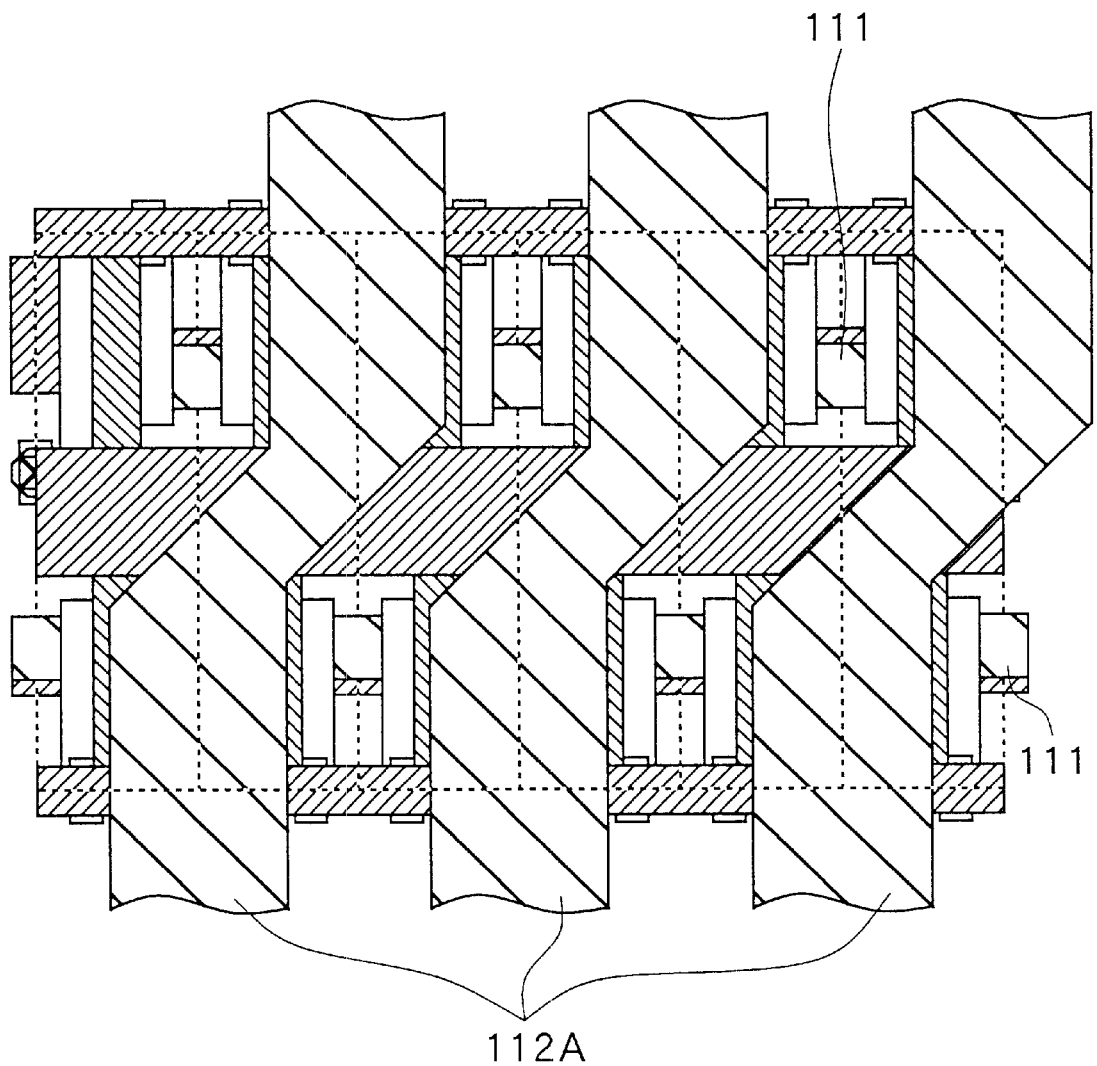
FIG. 11 shows a pattern configuration, explaining a step in the manufacturing process of the SRAM cell array following the step explained in FIG. 10.

As shown in FIG. 11, the bit line contact connection wire 111 is formed and the main word lines 112A are formed so as to avoid the bit line contact connection wires 111. In this embodiment, this main word line 112A is disposed every two memory cell rows and part of the main word line 112 A extends to the row adjacent to the two rows.

Figure 12:
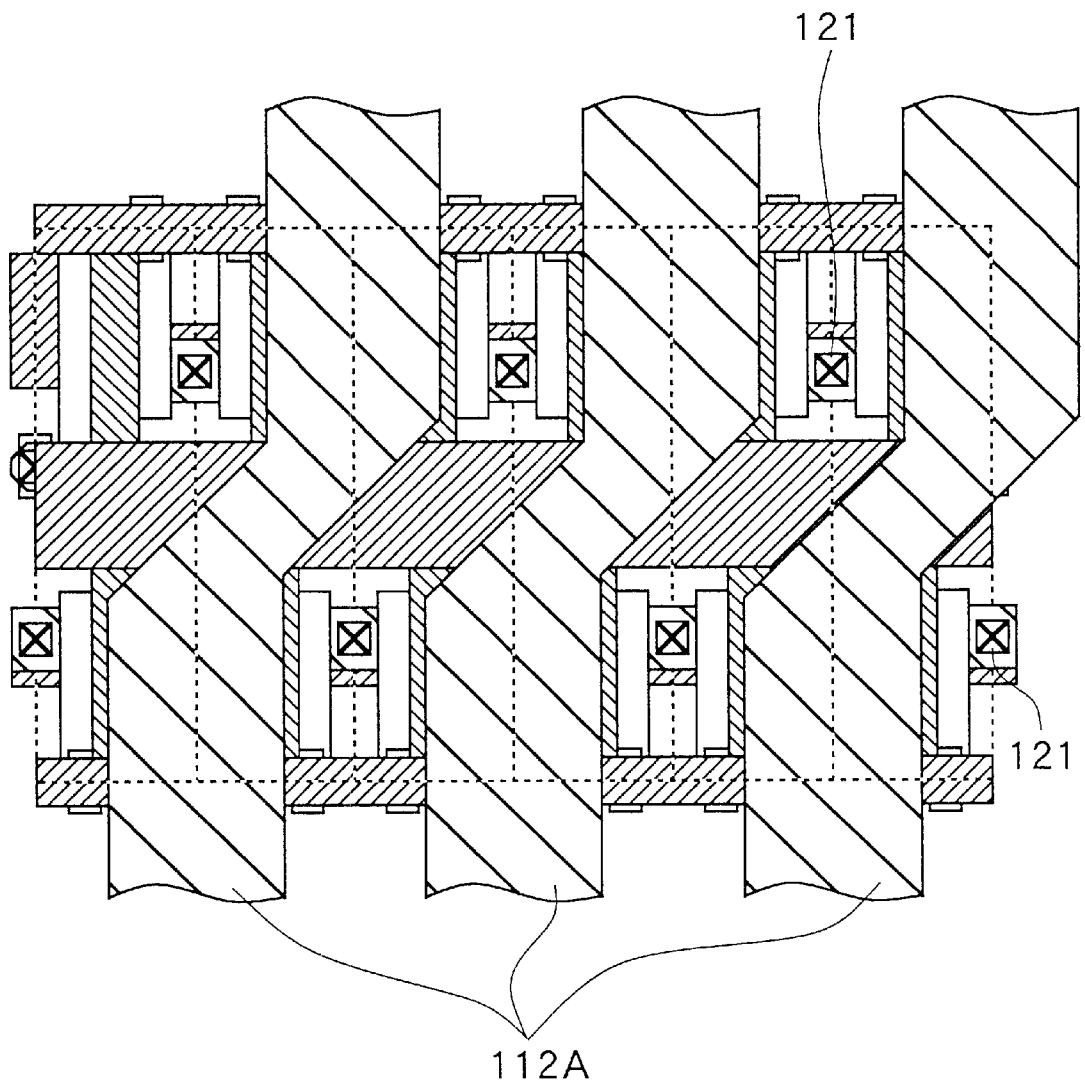
FIG. 12 shows a pattern configuration, explaining a step in the manufacturing process of the SRAM cell array following the step explained in FIG. 11.

As shown in FIG. 12, a fifth layer insulating film (not shown) is formed on the bit line contact connection wires 111 and the main word lines 112A. Thereafter, a bit line contact 121 is formed in correspondence to the bit line connection wire 93 in this layer insulating film.

Figure 13:
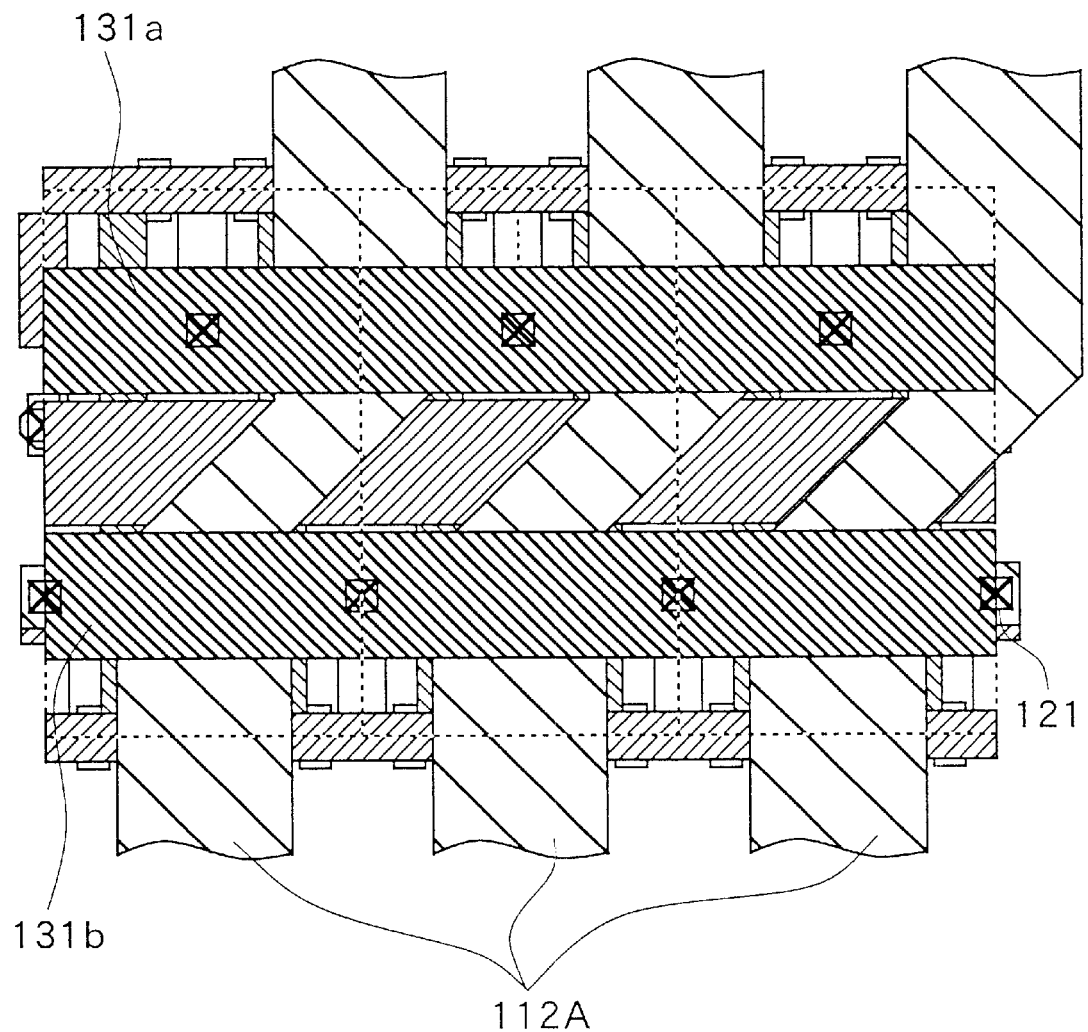
FIG. 13 shows a pattern configuration, explaining a step in the manufacturing process of the SRAM cell array following the step explained in FIG. 12.

As shown in FIG. 13, bit lines 131a and 131b (BL1 and BL2) to be connected to the bit line contacts 121 are formed. Aforementioned contacts and wires can be formed by the conventional semiconductor contact formation process and wire formation process. If necessary, the following step (not shown) is performed. A further upper wiring layer is formed. Thereafter, formation of an overcoat film, a window of the pads and the like are performed, and thereby a SRAM connection process is completed.

In the embodiment, as described above, the main word line 112A is formed so as to avoid the bit line contact connection wire 111 and bit line contact 121. Therefore, the main word line 112A can be formed in the layer below the bit lines 131a and 131b, thereby eliminating delay (bit line delay) caused by wire parasitic capacity.

FIG. 14 shows the results when operation time delay of the conventional SRAM cell and the SRAM cell of the invention are compared. The results reveal that when the main word line 112A is formed in the layer below the bit lines 131a and 131b, time delay in SRAM operation is improved by 0.46 nsec (12%) from 3.76 nsec to 3.30 nsec as compared to the case where the bit lines 131a and 131b are formed in the layer below the main word line 112A.

Figure 15:
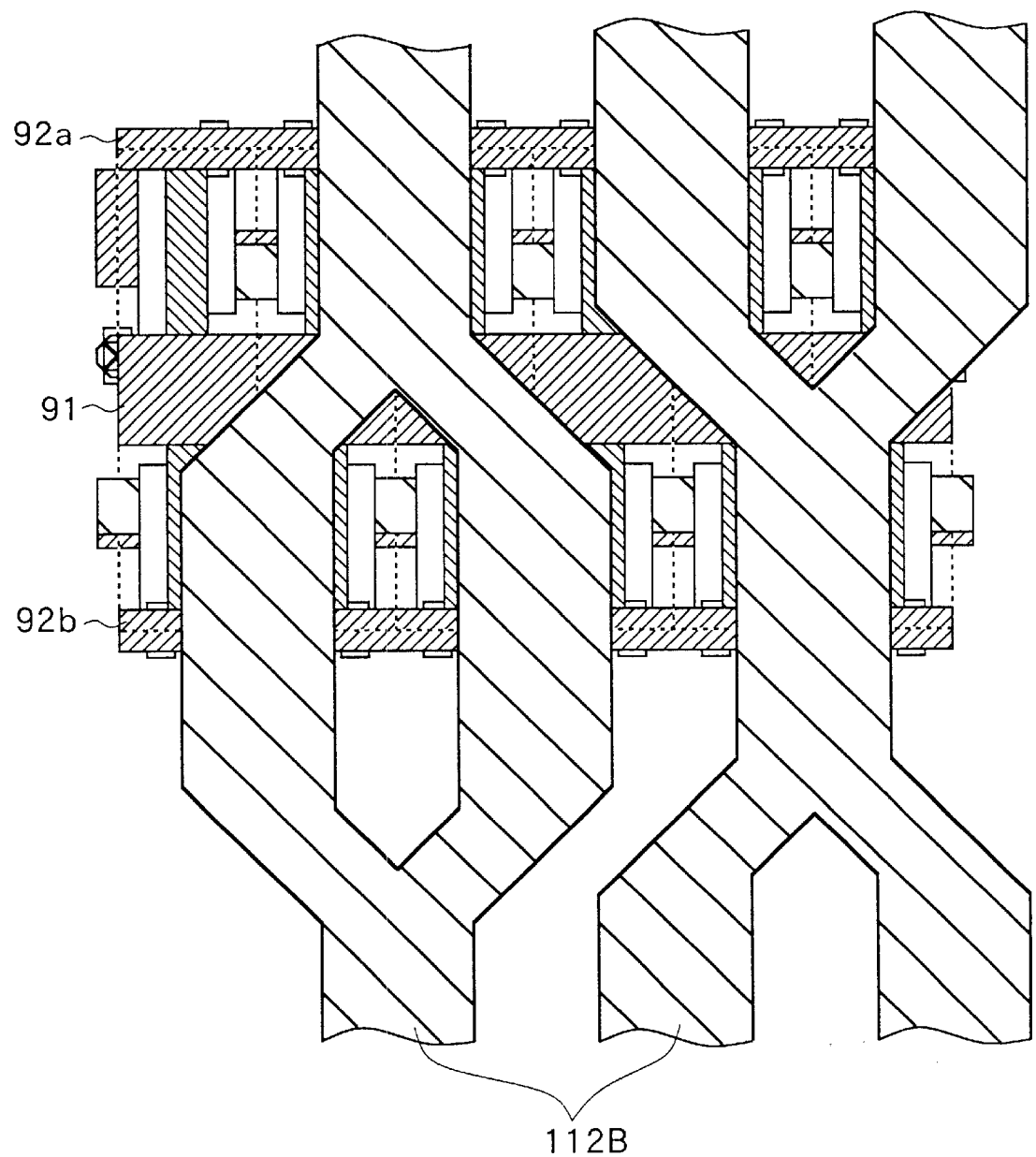
FIG. 15 shows a schematic pattern configuration of a SRAM cell array according to another embodiment of the invention.
Figure 16:
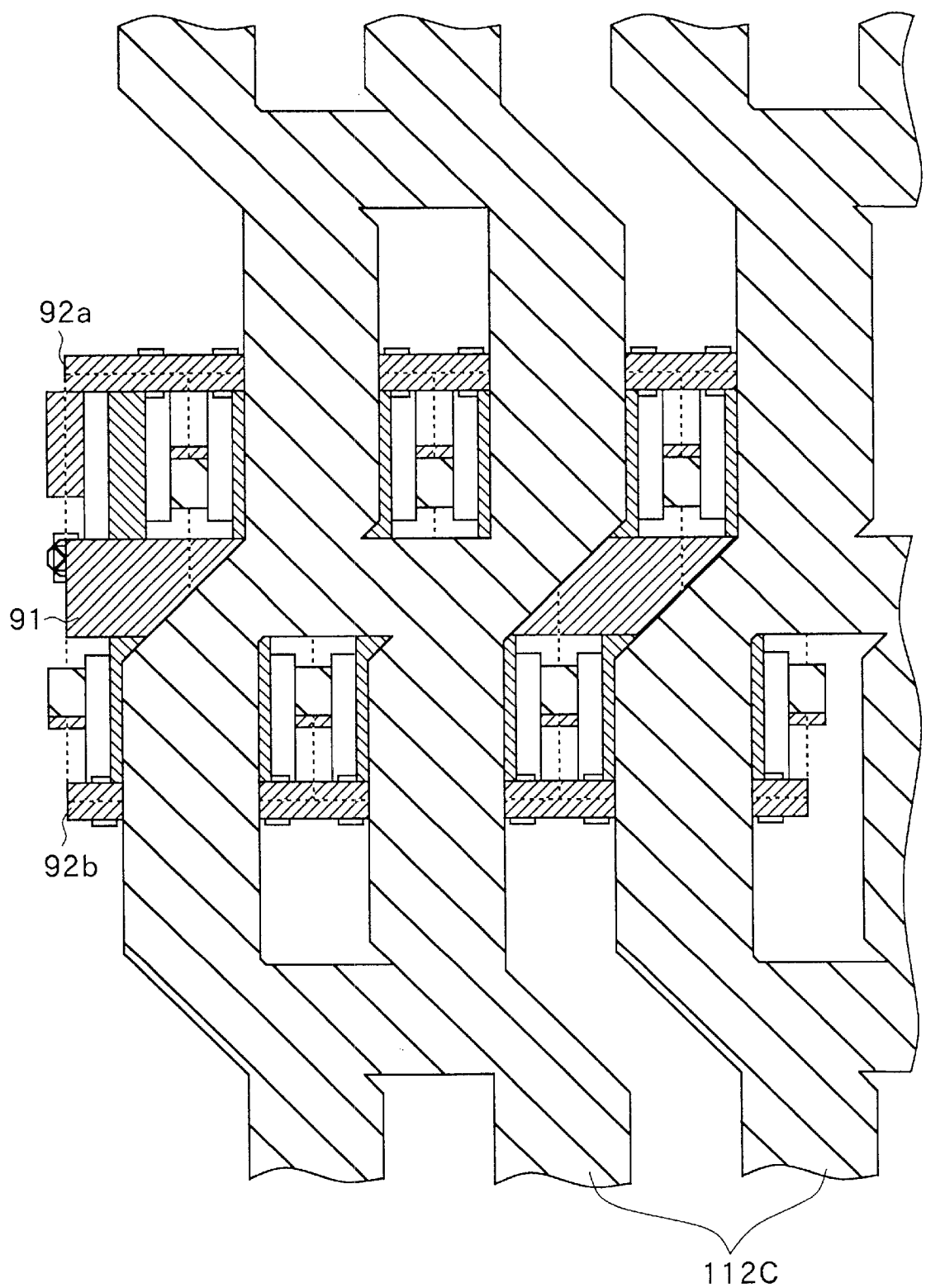
FIG. 16 shows a schematic pattern configuration of a SRAM cell array according to still another embodiment of the invention.

Although the present invention has been described above by exemplifying the embodiment, the present invention is not limited to the above-described embodiment and various modifications are possible. For example, in the embodiment above, the main word line 112A is arranged every two memory cell rows, but disposition of the main word line can be constituted as shown in FIG. 15 or 16. In a SRAM cell illustrated in FIG. 15, a main word line 112B having a Y-shape is placed repeatedly every three memory cell rows in a direction along which the memory cell array lies. In a SRAM cell shown in FIG. 16, a main word line 112C with a Y-shape is repeatedly disposed every four memory cell rows in a direction along which the memory cell array lies. The main word line in the FIG. 16 is constituted combining the pattern of the main word line in FIG. 15 and the pattern of the main word line in FIG. 11.

Figure 17:
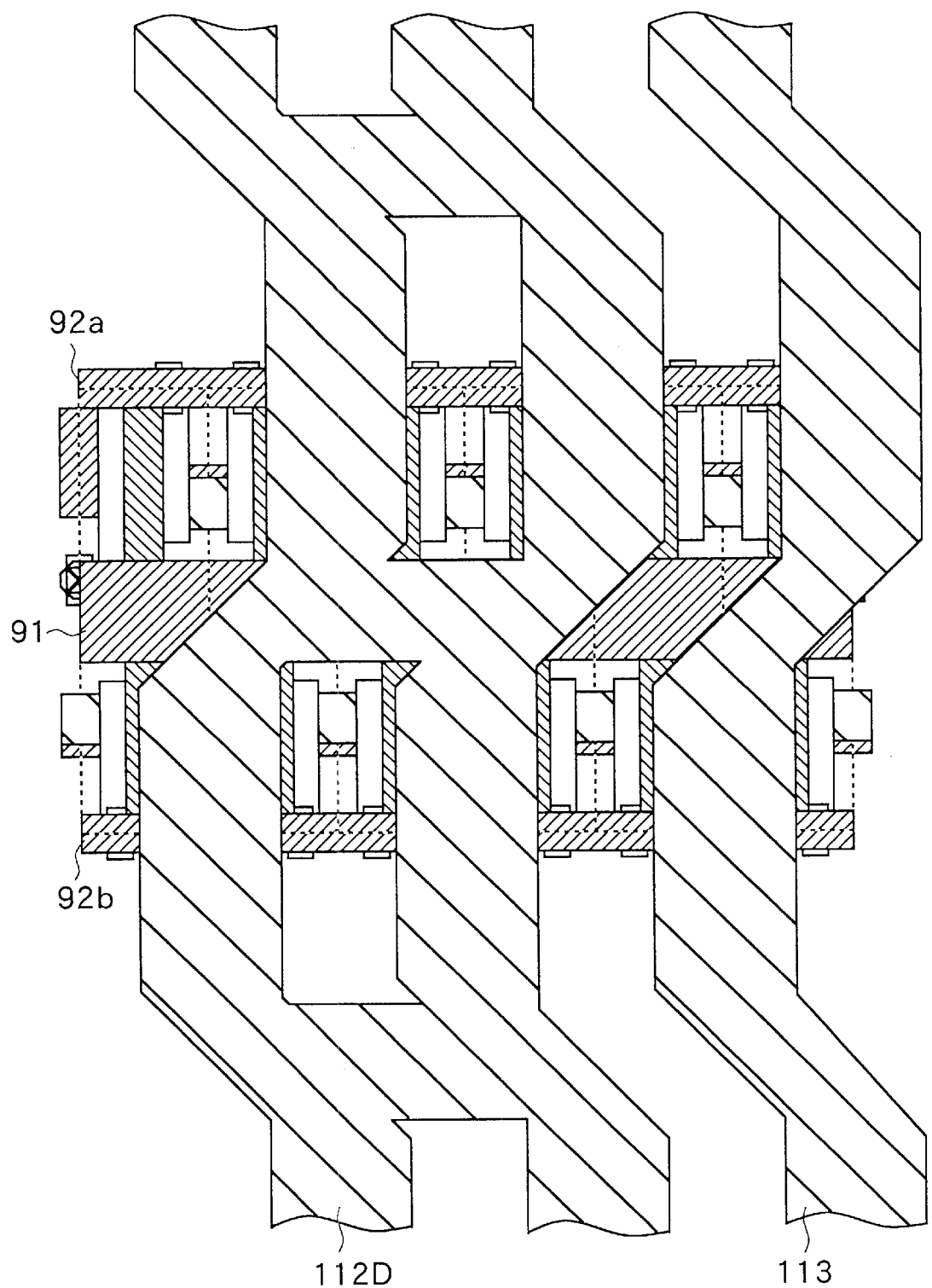
FIG. 17 shows a schematic pattern configuration of a SRAM cell array according to yet another embodiment of the invention.
Figure 18C:
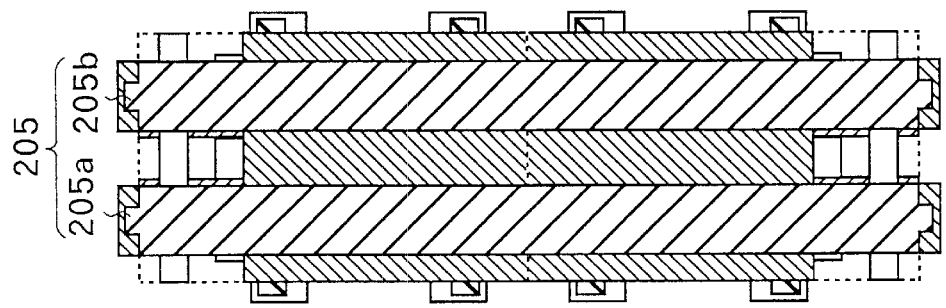
FIG. 18, consisting of FIGS. 18A through 18C, is a schematic configuration showing a pattern of a conventional SRAM cell array.
Figure 18B:
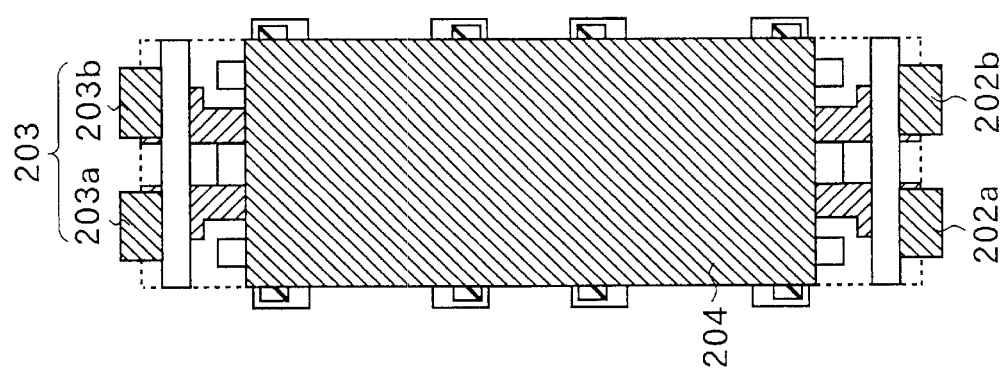
Figure 18A:
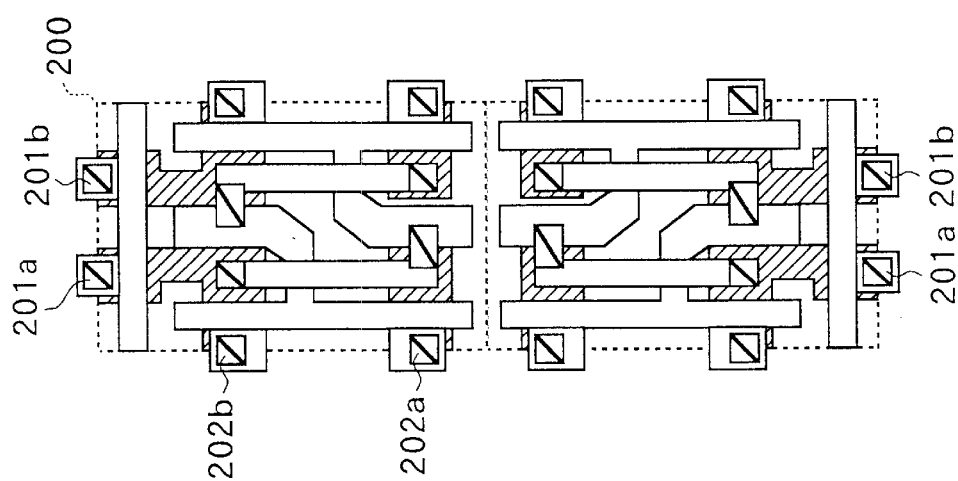
Figure 19:
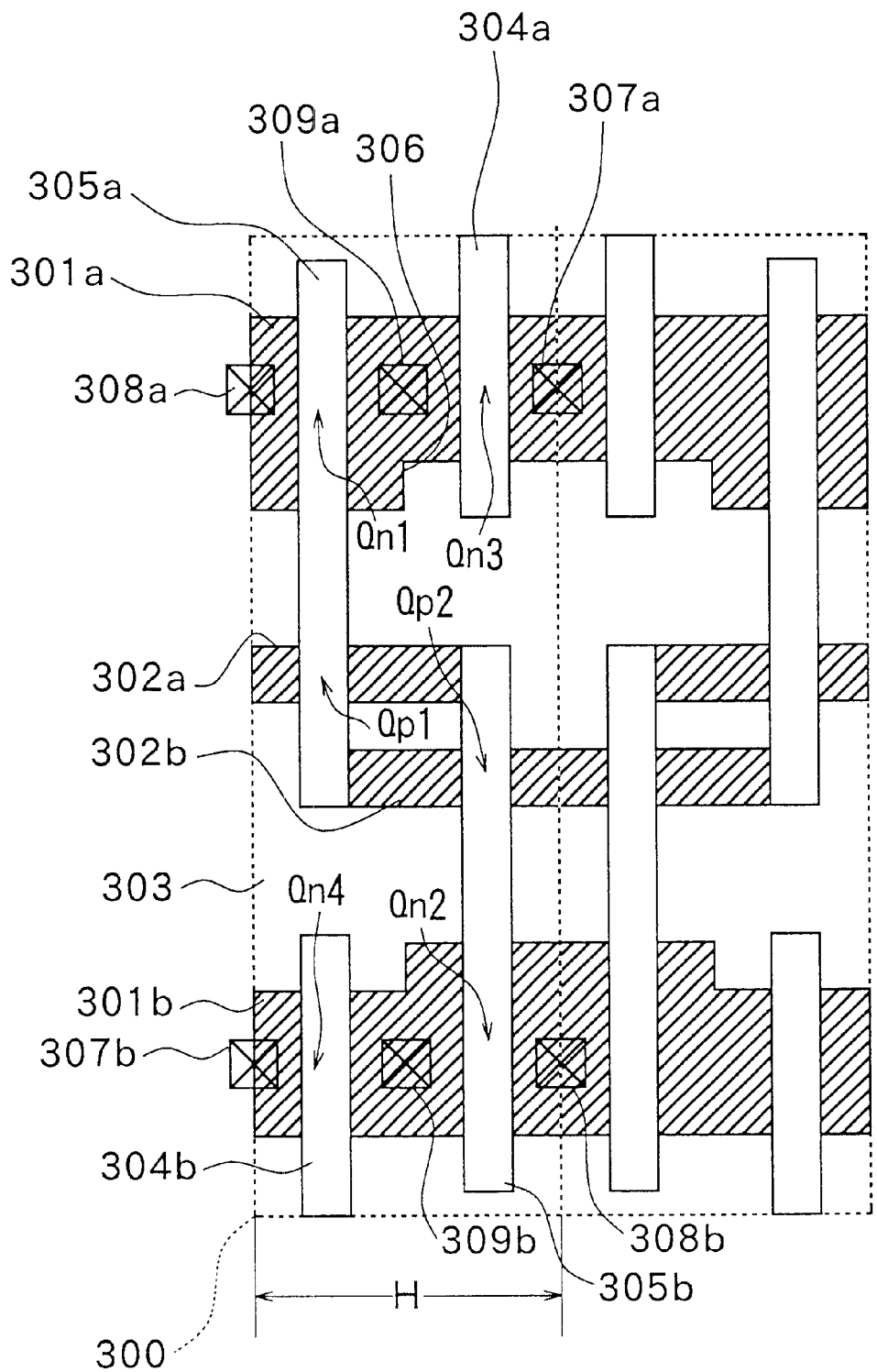
FIG. 19 is a schematic configuration showing a pattern of another conventional SRAM cell array.

In the embodiment above, in the layer in which the main word line is formed, only the main word line is formed, but at least one of an ancillary power supply voltage line and an ancillary grounded line may be placed with the main word line, and the main word line and either the ancillary power supply voltage line or the ancillary grounded line can be formed repeatedly. For example, in FIG. 17, the main word line 112D and an ancillary power supply voltage line ($V_{DD}$) 113 are repeatedly formed. In these examples, delay (bit line delay) caused by wire parasitic capacity is also eliminated, thereby making high-speed operation possible.

As described above, in the semiconductor memory device of the invention, the main word line is disposed so as to avoid the region where the bit line contact is formed, so the main word line can be formed in the layer below the bit line, and delay (bit line delay) caused by wire parasitic capacity between the main word line and the bit line is eliminated in the bit line, thereby making high-speed operation possible.

Obviously many modifications and variations of the present invention are possible in the light of the above teachings. It is therefore to be understood that within the scope of the appended claims the invention may be practiced otherwise than as specifically described.

What is claimed is:

1. A semiconductor memory device including a plurality of memory cells in which each memory cell includes a first and a second nMOS transistor connected so as to have a portion of the transistors crossing over each other and a first and a second PMOS transistor connected between a drain of an nMOS transistor and a power supply voltage line, respectively, and an nMOS transistor formation region where the first and the second nMOS transistors are formed and a pMOS transistor formation region where the first and the second pMOS transistors are formed and are arranged so as to extend along in the same direction as the direction along which a bit line extends, the semiconductor memory device comprising:

a main word line for inputting a common drive signal to a predetermined word line driver, the main word line being formed in a layer below the bit line and being disposed so as to avoid a bit line contact to electrically connect the bit line and a transistor region in a layer below the main word line, said plurality of memory cells being arranged in a plurality of adjacent memory cell rows which, in turn, form a memory cell array.

2. A semiconductor memory device according to claim 1, wherein the main word line is disposed every two memory cell rows and part of the main word line extends to the row adjacent to the two memory cell rows.

3. A semiconductor memory device according to claim 1, wherein the main word line is disposed repeatedly every three memory cell rows in a direction along which the memory cell array lies.

4. A semiconductor memory device according to claim 1, wherein the main word line is disposed repeatedly every four memory cell rows in a direction along which the memory cell array lies.

5. A semiconductor memory device according to claim 1, wherein the main word line is disposed every two memory cell rows having a shape combining a pattern such that part of the main word line is arranged so as to extend to the row adjacent to the two memory cell rows and a pattern such that the main word line is disposed repeatedly every four memory cell rows in a direction along which the memory cell array lies.

6. A semiconductor memory device according to claim 1, wherein at least either a voltage potential supply line or a reference potential supply line, and the main word line are repeatedly formed in alternate order in a direction along which the memory cell array lies in the same wiring layer.

7. A semiconductor memory device including a plurality of memory cells in which each memory cell includes a first and a second nMOS transistor, and additionally, a first and a second pMOS transistor connected between a drain of an nMOS transistor and a power supply voltage line, respectively, and an nMOS transistor formation region where the first and the second NMOS transistors are formed and a pMOS transistor formation region where the first and the second pMOS transistors are formed and are arranged so as to extend along in the same direction as the direction along which a bit line extends, the semiconductor memory device comprising:

a main word line for inputting a common drive signal to a predetermined word line driver, the main word line being formed in a layer below the bit line and being disposed so as to avoid a bit line contact to electrically connect the bit line and a transistor region in a layer below the main word line, said plurality of memory cells being arranged in a plurality of adjacent memory cell rows which, in turn, form a memory cell array, wherein the main word line is disposed every two memory cell rows and part of the main word line extends to the row adjacent to the two memory cell rows.

8. A semiconductor memory device including a plurality of memory cells in which each memory cell includes a first and a second NMOS transistor, and additionally, a first and a second pMOS transistor connected between a drain of an nMOS transistor and a power supply voltage line, respectively, and an nMOS transistor formation region where the first and the second nMOS transistors are formed and a pMOS transistor formation region where the first and the second pMOS transistors are formed and are arranged so as to extend along in the same direction as the direction along which a bit line extends, the semiconductor memory device comprising:

a main word line for inputting a common drive signal to a predetermined word line driver, the main word line being formed in a layer below the bit line and being disposed so as to avoid a bit line contact to electrically connect the bit line and a transistor region in a layer below the main word line, said plurality of memory cells being arranged in a plurality of adjacent memory cell rows which, in turn, form a memory cell array, wherein the main word line is disposed repeatedly every three memory cell rows in a direction along which the memory cell array lies.

9. A semiconductor memory device including a plurality of memory cells in which each memory cell includes a first and a second nMOS transistor, and additionally, a first and a second pMOS transistor connected between a drain of an nMOS transistor and a power supply voltage line, respectively, and an nMOS transistor formation region where the first and the second nMOS transistors are formed and a pMOS transistor formation region where the first and the second pMOS transistors are formed and are arranged so as to extend along in the same direction as the direction along which a bit line extends, the semiconductor memory device comprising:

a main word line for inputting a common drive signal to a predetermined word line driver, the main word line being formed in a layer below the bit line and being disposed so as to avoid a bit line contact to electrically connect the bit line and a transistor region in a layer below the main word line, said plurality of memory cells being arranged in a plurality of adjacent memory cell rows which, in turn, form a memory cell array, wherein the main word line is disposed repeatedly every four memory cell rows in a direction along which the memory cell array lies.

10. A semiconductor memory device including a plurality of memory cells in which each memory cell includes a first and a second nMOS transistor, and additionally, a first and a second pMOS transistor connected between a drain of an nMOS transistor and a power supply voltage line, respectively, and an nMOS transistor formation region where the first and the second nMOS transistors are formed and a pMOS transistor formation region where the first and the second pMOS transistors are formed and are arranged so as to extend along in the same direction as the direction along which a bit line extends, the semiconductor memory device comprising:

a main word line for inputting a common drive signal to a predetermined word line driver, the main word line being formed in a layer below the bit line and being disposed so as to avoid a bit line contact, said plurality of memory cells being arranged in a plurality of adjacent memory cell rows which, in turn, form a memory cell array, wherein the main word line is disposed every two memory cell rows having a shape combining a pattern such that part of the main word line is arranged so as to extend to the row adjacent to the two memory cell rows and a pattern such that the main word line is disposed repeatedly every four memory cell rows in a direction along which the memory cell array lies.

* * * * *